United States Patent [19]

Linn et al.

[11] 4,079,341

[45] Mar. 14, 1978

[54] MICROWAVE OSCILLATOR HAVING FEEDBACK COUPLED THROUGH A DIELECTRIC RESONATOR

[75] Inventors: Donald Floyd Linn, Kempton; James Kevin Plourde; Clarence Burke Swan, both of Allentown, all of Pa.

[73] Assignee: Bell Telephone Laboratories, Incorporated, Murray Hill, N.J.

[21] Appl. No.: 773,197

[22] Filed: Mar. 1, 1977

[51] Int. Cl.² ............................................. H03B 5/18
[52] U.S. Cl. ................................. 331/96; 331/117 D; 333/82 R
[58] Field of Search .................. 331/96, 107 R, 107 G, 331/117 D; 333/82 R

[56] References Cited

U.S. PATENT DOCUMENTS

| 2,825,813 | 3/1958 | Sperling | 331/116 R |
| 2,926,312 | 2/1960 | Brand et al. | 331/77 |
| 3,611,206 | 10/1971 | Miyake et al. | 331/116 R |
| 3,840,828 | 10/1974 | Linn et al. | 333/73 S |
| 3,883,824 | 5/1975 | Weiner | 331/96 X |
| 4,016,506 | 4/1977 | Kofol | 331/96 |

*Primary Examiner*—Siegfried H. Grimm
*Attorney, Agent, or Firm*—Maurice M. de Picciotto; Lucian C. Canepa

[57] ABSTRACT

An apparatus for stabilizing microwave oscillator circuits is disclosed. The apparatus comprises a dielectric resonator positioned in the vicinity of a microwave semiconductive device for completing a feedback path between two electrode circuits of the device. A dielectric spacer is positioned between the resonator and the electrodes for supporting the resonator and controlling the magnitude of coupling between the two electrode circuits. A folded mechanical structure is described wherein the oscillating device and the resonator are located at the fold for improving the frequency stability of the oscillator. The microwave semiconductive device may be a bipolar transistor or a field effect transistor.

10 Claims, 9 Drawing Figures

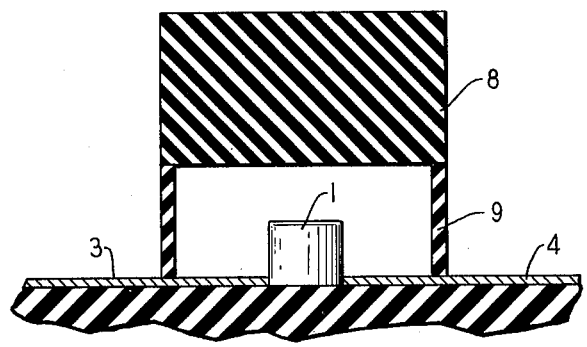
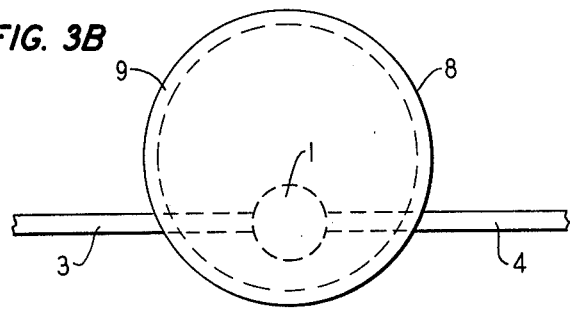
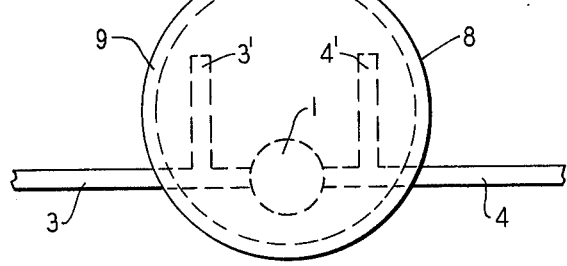
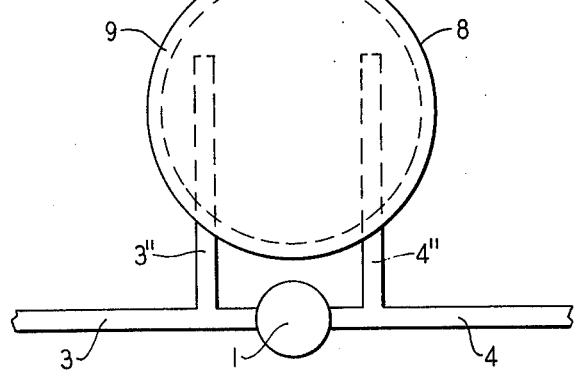

MICROWAVE OSCILLATOR HAVING FEEDBACK COUPLED THROUGH A DIELECTRIC RESONATOR

The present invention relates to microwave circuits, and more particularly to an apparatus for stabilizing microwave oscillator circuits.

BACKGROUND OF THE INVENTION

Frequency stabilization of an oscillator usually requires a high Q circuit coupled to an oscillating device. In some known transistor oscillators, such as described in U.S. Pat. No. 2,825,813, issued Mar. 4, 1958 to J. C. Sperling and U.S. Pat. No. 3,611,206, issued Oct. 5, 1971, to Y. Miyake et al, a piezoelectric crystal is coupled between the emitter and collector electrode circuits of the oscillating transistor. These piezoelectric crystals provide higher Qs and higher frequency stability than is available from microwave cavity resonators. The frequency of operation of such known transistor crystal oscillators is of the order of a few MHz. However, such known arrangements are inadequate for directly stabilizing microwave oscillators in the range of 2 to 5 GHz. Furthermore, these known transistor crystal oscillators require complex and expensive circuitry including several capacitances and inductances.

A known high frequency transistor oscillator is described in U.S. Pat. No. 2,926,312, issued Feb. 23, 1960 to F. A. Brand et al., wherein a parallel-resonant tank circuit is coupled to the collector electrode of the transistor, and a variable capacitance is coupled between the parallel-resonant tank circuit and the emitter electrode of the transistor. The variable capacitance provides means for varying the amount of feedback between the tank circuit and the emitter-base circuit of the oscillator. Although this known transistor oscillator may generate harmonic output power at frequencies as high as 3.4 GHz, the complexity, size and difficulty in accurately tuning and ajusting the various variable circuit elements of the proposed arrangement render this transistor oscillator inadequate as a compact, low-cost, frequency stabilized microwave oscillator.

Use of dielectric resonators in microwave filters is described in U.S. Pat. No. 3,840,828, issued Oct. 8, 1974, to D. F. Linn et al. and assigned to the present assignee. In this known filter arrangement, a dielectric resonator is disposed over a stripline conductor such that the magnetic field lines of the stripline pass through the planar parallel surfaces of the resonator to a maximum degree. This known arrangement operates satisfactorily for its intended purpose, i.e., as a microwave filter, wherein neither microwave active elements nor feedback paths are required to perform the filtering function.

SUMMARY OF THE INVENTION

The foregoing problems are solved in accordance with an embodiment of the present invention wherein a microwave oscillator circuit comprises a microwave semiconductive device having at least first and second electrode terminals, and a dielectric resonator positioned in the vicinity of the device for completing a feedback path between the first and second electrode terminals. A dielectric spacer is positioned between the electrode terminals and the resonator for supporting the latter and controlling the magnitude of coupling between the electrode terminals. In accordance with the present invention, the semiconductive device may, for example, be either a microwave bipolar transistor or a microwave field effect transistor.

In accordance with a preferred embodiment of the present invention, a microwave oscillator comprises a microwave transistor device having at least first and second electrode branch circuits; a carrier plate having first and second planar surfaces for respectively supporting the first and second electrode branch circuits, the transistor device being positioned at one end of the plate between the two surfaces; and a dielectric resonator positioned proximate to the transistor device for completing a feedback path between the first and second electrode branch circuits. By varying the height of a dielectric spacer, e.g., a quartz tubing positioned between the transistor device and the resonator, the coupling between the two electrode branch circuits may be controlled.

One advantage of the present invention is to realize a small, low-cost microwave oscillator having high frequency stability.

Another advantage of the present invention is to realize a compact oscillator circuit configuration which can be mounted in a compact temperature-controlled oven for improved frequency stability.

Another advantage of the present invention is to realize a compact oscillator circuit configuration wherein differential thermal expansion effects are substantially reduced.

Another advantage of the present invention is to reduce frequency pulling and Q degradation effects in small microwave oscillators.

A still further advantage of the present invention is to realize a substantially low-noise oscillator resulting from the high Q of a dielectric resonator.

These and other objects and advantages of this invention will appear more fully upon consideration of the various illustrative embodiments now to be described in detail in connection with the accompanying drawing.

BRIEF DESCRIPTION OF THE DRAWING

FIGS. 3A and 3B show one illustrative embodiment of a microwave oscillator according to the present invention;

FIGS. 4A and 4B show alternative circuit configurations for the microwave oscillator of FIGS. 3A and 3B;

DETAILED DESCRIPTION

Figure 1:
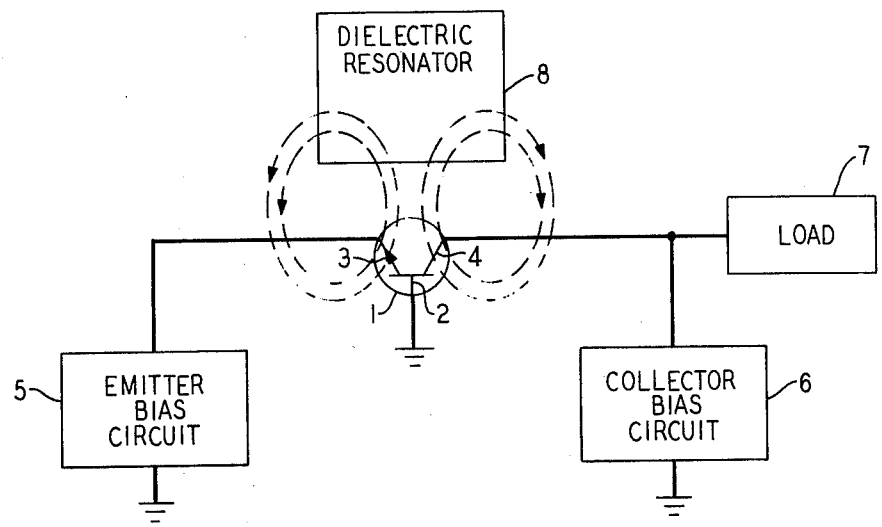
FIG. 1 is a schematic block diagram of one illustrative embodiment of the present invention.

Referring to FIG. 1, there is schematically illustrated a microwave oscillator in accordance with the present invention. The oscillator comprises a microwave semiconductive device, which for explanation purposes only is a microwave transistor 1 having a base electrode branch circuit 2, an emitter electrode branch circuit 3, and a collector electrode branch circuit 4. Other microwave semiconductive devices capable of generating microwave oscillations may be substituted for transistor 1. Moreover, although in FIG. 1 microwave transistor 1 is shown as an NPN transistor in the common base configuration, i.e., having the base electrode circuit 2 coupled to ground potential, having the emitter electrode circuit 3 as the input circuit, and having the collector electrode circuit 4 as the output circuit, the principles of the present invention are also applicable to common emitter, as well as common collector, configurations of this or other types of transistors. Emitter electrode circuit 3 is coupled to an emitter bias supply circuit 5, and collector electrode circuit 4 is coupled to a collector bias supply circuit 6 and to a load 7. In accordance with the present invention, a small electrodeless dielectric resonator 8 is positioned proximate to emitter electrode circuit 3 and collector electrode circuit 4. The properties of dielectric resonator 8 are such that it is used in accordance with an embodiment of the present invention to achieve a feedback path between collector electrode circuit 4 and emitter electrode circuit 3. The small size along with the manner in which the resonator can be coupled through its external fields enable the resonator to be simultaneously coupled to both the emitter and collector circuits of microwave transistor 1.

Dielectric resonator 8 may be made of barium titanate ($Ba_2Ti_9O_{20}$), such as disclosed in U.S. Pat. No. 3,938,064, issued on Feb. 10, 1976 to H. M. O'Bryan et al. and assigned to the assignee hereof. Other known dielectric materials, e.g., lithium tantalate ($LiTaO_3$), lithium niobate ($LiNbO_3$), or a composition of titanium dioxide ($TiO_2$) with either $LiTaO_3$ or $LiNbO_3$ may be used as dielectric resonator 8 without departing from the spirit and principles of the present invention. In an illustrative embodiment of the present invention, dielectric resonator 8 is preferably a single-phase $Ba_2Ti_9O_{20}$ ceramic dielectric resonator having at 4 GHz a quality factor Q of the order of 8000 to 11000, a dielectric constant of 39.8, and a temperature coefficient of resonant frequency of +2 ppm/degrees C. In such a resonator, the $TE_{01\delta}$ mode has a magnetic dipole type field pattern that extends outwardly from the resonator, as shown in FIG. 1 by dashed lines and arrowheads. Thus, dielectric resonator 8 can be coupled to a stripline or to a microstripline forming electrode circuits 3 and 4 when located proximate to and at a predetermined distance from emitter and collector electrode circuits 3 and 4. Various embodiments and configurations will be hereinafter described for realizing both the required coupling distribution as well as the phase shift through the feedback path.

Figure 2:
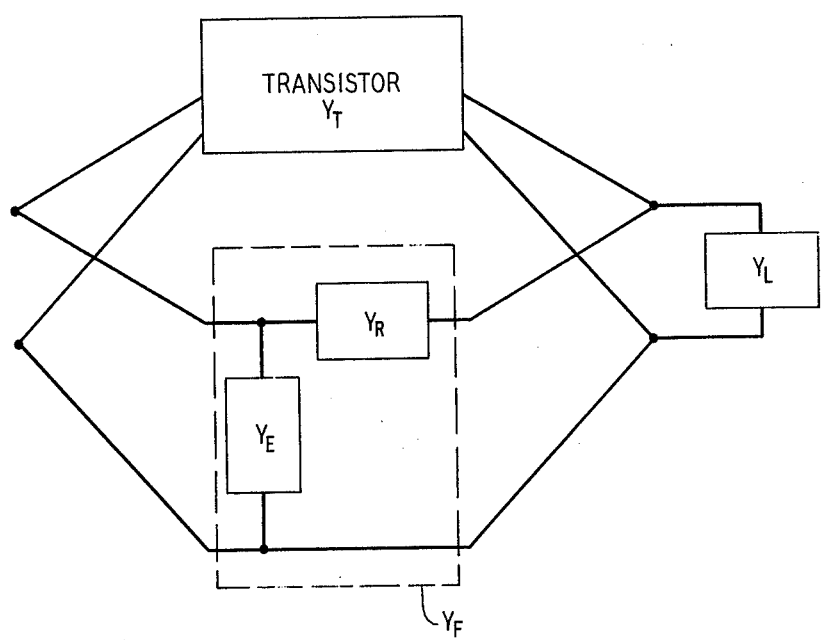
FIG. 2 is the equivalent admittance representation of the embodiment of FIG. 1.

An equivalent admittance representation of the illustrative embodiment of FIG. 1 is shown in FIG. 2 wherein $Y_T$ is the transistor admittance and $Y_L$ is the load admittance consisting of the admittance of the circuits coupled to collector electrode circuit 4, and of a 50 ohm impedance load 7. In accordance with an illustrative embodiment of the present invention, the feedback admittance $Y_F$ between the collector electrode circuit 4 and the emitter electrode circuit 3 contains the resonator admittance $Y_R$ and the circuit admittance $Y_E$.

One illustrative embodiment of a microwave oscillator according to the present invention is shown in FIGS. 3A and 3B wherein identical numerals corresponding to the numerals of FIG. 1 are utilized to illustrate similar circuit elements. Dielectric resonator 8 is positioned above microwave transistor 1 and maintained at a predetermined distance therefrom by means of a dielectric spacer 9. Spacer 9 is preferably formed from a section of quartz tubing cut to a predetermined length. However, other dielectric spacing means can be used to mechanically support dielectric resonator 8 and to provide low dielectric loss and low thermal expansion. In FIGS. 3A and 3B the physical dimensions of transistor 1, resonator 8 and dielectric spacer 9 are substantially increased to enable a better understanding of the principles of the present invention. In particular, dielectric resonator 8 is shown as a cylinder maintained in position above emitter circuit 3 and collector circuit 4 by means of cylindrical spacer 9. Other geometrical forms for dielectric resonator 8 and spacer 9 can be used within the spirit and principles of the present invention. The small size of dielectric spacer 9, along with the coupling of the external fields of resonator 8 with the emitter and collector circuits enable the completion of a feedback path therebetween. The small, low temperature coefficient, high Q dielectric resonator 8 is thus used as a feedback path to stabilize the frequency of the oscillator. Moreover, the magnitude of feedback coupling between emitter and collector circuits 3 and 4 is primarily a function of the height of dielectric spacer 9.

FIGS. 4A and 4B show alternative circuit configurations for the microwave oscillator of FIG. 3. In FIG. 4A, dielectric resonator 8 is positioned above microwave transistor 1 as well as above two circuits 3' and 4'. Emitter electrode circuit 3 is provided with a circuit 3', while collector electrode circuit 4 is provided with a circuit 4'. The addition of circuits 3' and 4' to electrode circuits 3 and 4, respectively, enables an adjustment of the feedback coupling and the phase shift through the feedback path between emitter and collector circuits 3 and 4. By varying the dimensions of circuits 3' and 4', the latter two parameters can be conveniently adjusted.

Another alternative circuit configuration shown in FIG. 4B is similar to the one shown in FIG. 4A except that circuits 3" and 4" are respectively longer than circuits 3' and 4'. This results in positioning the small dielectric resonator 8 away from transistor 1 on top of portions of circuits 3" and 4". In this alternative circuit configuration, the feedback coupling and the phase shift through the feedback path can be modified by varying the length of the circuits and/or laterally displacing the dielectric resonator with respect to transistor 1. Circuits 3', 4', 3" and 4" in combination with the dielectric resonator provide reactive tuning of the transistor electrode circuits, enabling an adjustment of the phase shift of the feedback path.

Figure 5A:
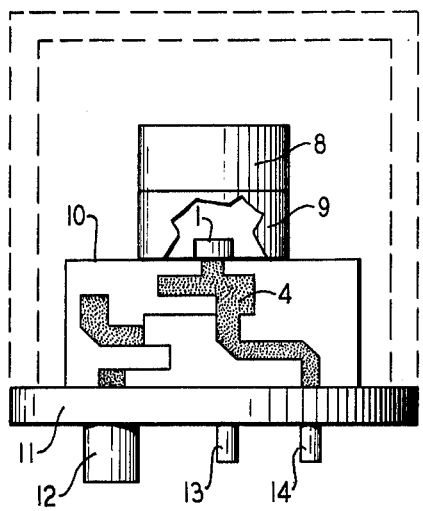
FIGS. 5A and 5B show another illustrative embodiment of a microwave oscillator according to the present invention.
Figure 5B:
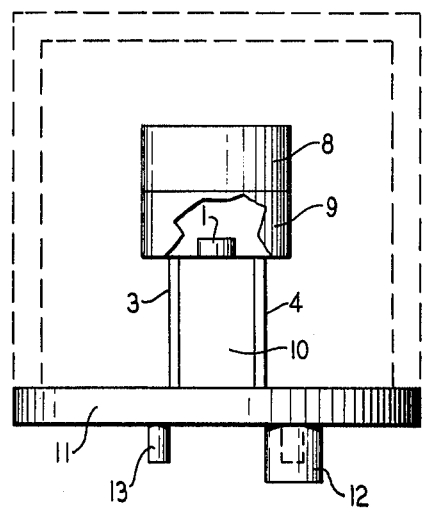

FIGS. 5A and 5B respectively show a front view and a side view of another illustrative embodiment of a microwave oscillator according to the present invention. This other illustrative embodiment, referred to as the "folded oscillator structure", comprises identical reference numerals corresponding to the numerals of FIGS. 3 and 4. The folded structure comprises a carrier plate 10 for supporting microwave transistor 1 and its emitter and collector circuits 3 and 4. The emitter and collector circuits are formed on an alumina substrate according to well-known microwave integrated circuit (MIC) technology. The carrier plate 10 is attached to a base 11 having a plurality of connection terminals 12, 13 and 14. Terminal 12 corresponds to the collector bias terminal to be coupled to the bias circuit 6 of FIG. 1. Terminal 14 corresponds to the output terminal of the oscillator to be coupled to the load 7 of FIG. 1. Various matching impedance sections may be coupled to collector circuit 4 between the transistor 1 and terminals 12 and 14. The emitter circuit 3 is coupled to terminal 13 for providing the required emitter bias potential generated by the emitter bias circuit 5 of FIG. 1. Carrier plate 10 may be made of a conducting or a nonconducting material, provided its thermal expansion approximately matches that of the ceramic, alumina, or other substrate for emitter and collector circuits 3 and 4. Conducting materials, such as aluminum, brass, nickel-steel compounds or other metallic composition may be used as carrier plate 10.

As shown in FIGS. 5A and 5B, the microwave transistor 1 is positioned at the "fold" of the structure. The dielectric resonator 8 is located above the transistor 1 and held in position by means of dielectric spacer 9. The folded oscillator structure enables the realization of a small microwave oscillator wherein a single carrier plate, approximately matched in thermal expansion to the ceramic substrate, is used to support both emitter and collector circuit substrates. Moreover, all electrical connections in such a folded structure can be made in a single plane perpendicular to the carrier plate such that differential thermal expansion effects between the device housing and the carrier plate/substrates are insignificant. Also, due to the reduction of the ground plane area under dielectric resonator 8, frequency pulling and Q degradation effects are substantially reduced. By way of example only, for a 4.5 GHz microwave oscillator, the dielectric resonator is preferably made of a $Ba_2Ti_9O_{20}$ cylinder having a diameter of the order of 0.5 inch and a height of the order of 0.2 inch. Dielectric spacer 9 is preferably a quartz cylindrical tube having a height between 150 and 300 mils. Thus, in such a folded structure with the foregoing preferred dimensions, significant coupling of the dielectric resonator to the emitter and collector circuits occurs only in the immediate vicinity of the transistor.

Figure 6:
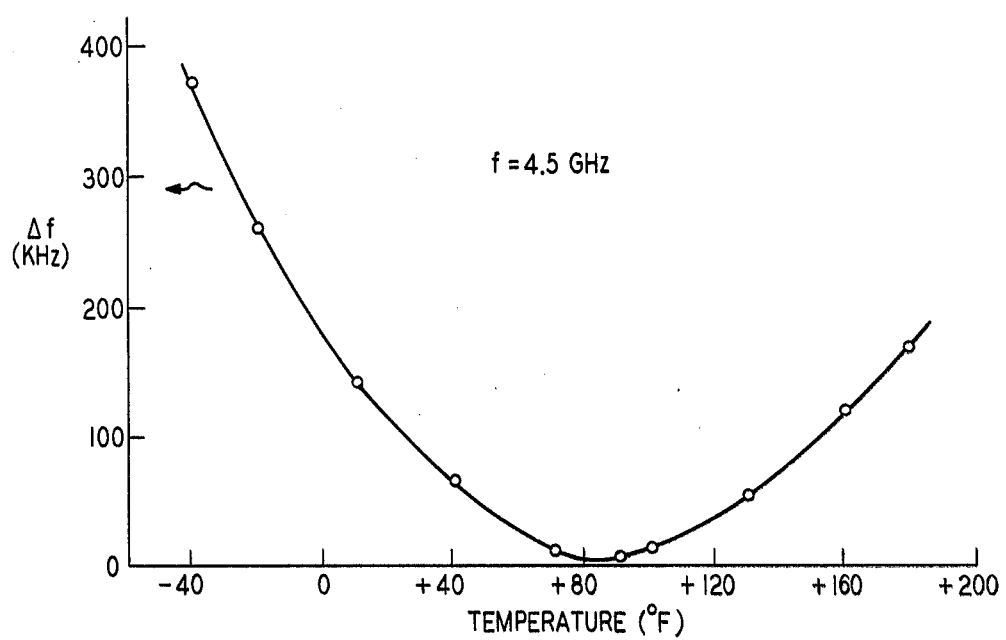
FIG. 6 shows the frequency variation as a function of the temperature of the embodiment of FIGS. 5A and 5B.

Some typical temperature stability results for a 4.5 GHz "folded structure" oscillator are presented in FIG. 6. The differential thermal expansion between the spacer-resonator-carrier plate structure and the oscillator housing has been used to improve the temperature stability beyond that already inherent in the resonator itself. If 77° F is chosen as the reference temperature, the linear and quadratic temperature coefficients for a resonator are +0.68 ppm/degrees F and +0.0054 ppm/degrees $F^2$. The temperature coefficients for the oscillator are −0.21 ppm/degrees F and +0.0055 ppm/degrees $F^2$. Therefore, this effect adds a compensating linear temperature coefficient which can be advantageously used to shift the zero temperature coefficient of resonant frequency point to a higher temperature. Over the 0° to 160° F range, the total frequency variation is 200 kHz which corresponds to 44 ppm. When mounted in a temperature-controlled oven, long term stability of less than 5 ppm over one year has been achieved.

In the above description, the microwave device 1 was illustrated as a microwave transistor coupled in the common base circuit configuration. However, the present invention is not limited to bipolar transistor oscillators. Other semiconductive microwave devices capable of generating microwave oscillations may be substituted for transistor 1. Furthermore, in applications requiring frequencies typically above 5 GHz, use of a field effect microwave transistor, such as a gallium-arsenide field effect transistor (GaAsFET), enables the direct generation of microwave power in a simple, compact and economic manner.

It is to be understood that the embodiments described herein are merely illustrative of the apparatus according to the present invention. Various modifications may be made thereto by persons skilled in the art without departing from the spirit and scope of the invention.

What is claimed is:

1. A microwave oscillator circuit comprising:
   a microwave semiconductive device having at least first and second electrode circuits: and
   a dielectric resonator positioned in the vicinity of said device for completing a feedback path between said first and said second electrode circuits,
   wherein means positioned between said electrode circuits and said dielectric resonator comprise a dielectric spacer for controlling the magnitude of coupling between said first and said second electrode circuits.

2. A microwave oscillator circuit according to claim 1 wherein said semiconductive device is a microwave bipolar transistor device.

3. A microwave oscillator circuit according to claim 1 wherein said semiconductive device is a microwave field effect transistor.

4. A microwave oscillator comprising a microwave transistor device having at least first and second electrode branch circuits;
   a carrier plate having first and second planar surfaces for respectively supporting said first and said second electrode branch circuits;
   means for positioning said transistor device at one end of said plate between said surfaces; and
   a dielectric resonator positioned proximate to said transistor device for completing a feedback path between said first and said second electrode branch circuits.

5. A microwave oscillator circuit according to claim 4 wherein the oscillator circuit further comprises spacing means positioned between said transistor device and said dielectric resonator for controlling the coupling between said electrode branch circuits.

6. A microwave oscillator according to claim 5 wherein said spacing means positioned between said transistor device and said dielectric resonator comprise a dielectric spacer.

7. A microwave oscillator according to claim 6 wherein said transistor is an npn bipolar junction microwave transistor, and
   wherein said first and second electrode branch circuits are respectively the emitter circuit and the collector circuit.

8. A microwave oscillator according to claim 7 wherein said dielectric spacer comprises a quartz annulus.

9. A microwave oscillator according to claim 8 wherein said dielectric resonator is a circular cylindrical resonator made from barium titanate ($Ba_2Ti_9O_{20}$), and wherein the mode of electrical oscillations in said resonator is the $TE_{01\delta}$ mode.

10. A microwave oscillator circuit comprising:
    a microwave semiconductive amplifying device having separate input and output circuits;
    a dielectric resonator; and
    means for positioning said resonator with respect to said input and said output circuits to provide feedback coupling between said input and said output circuits to cause said amplifying device to oscillate at a frequency determined substantially by said resonator.

* * * * *